(12) United States Patent
Li

(10) Patent No.: US 7,827,658 B2
(45) Date of Patent: Nov. 9, 2010

(54) METHOD FOR MANUFACTURING ACTUATOR DEVICE AND LIQUID EJECTING HEAD INCLUDING ACTUATOR DEVICE PREPARED BY THE METHOD

(75) Inventor: Xin-Shan Li, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 305 days.

(21) Appl. No.: 11/692,037

(22) Filed: Mar. 27, 2007

(65) Prior Publication Data

US 2007/0226974 A1 Oct. 4, 2007

(30) Foreign Application Priority Data

Mar. 28, 2006 (JP) .............................. 2006-088889

(51) Int. Cl.
*H01L 41/22* (2006.01)
*H01L 41/00* (2006.01)
*H04R 17/00* (2006.01)
*B23P 17/00* (2006.01)
*B21D 53/76* (2006.01)
*H02N 2/00* (2006.01)
*B41J 2/045* (2006.01)

(52) U.S. Cl. ..................... 29/25.35; 29/890.1; 310/324; 347/70

(58) Field of Classification Search ................ 29/890.1, 29/25.35; 310/321, 324; 347/70
See application file for complete search history.

(56) References Cited

U.S. PATENT DOCUMENTS 7,140,084 B2 * 11/2006 Yamada et al. ............. 29/25.35
2005/0168524 A1 * 8/2005 Xin-Shan et al. ............. 347/40

FOREIGN PATENT DOCUMENTS

| JP | 11-204849 | | 7/1999 |
| JP | 2004-195994 | | 7/2004 |
| JP | 2005-166719 | | 6/2005 |
| JP | 2005-176433 | * | 6/2005 |

* cited by examiner

*Primary Examiner*—A. Dexter Tugbang
*Assistant Examiner*—David P Angwin
(74) *Attorney, Agent, or Firm*—Workman Nydegger

(57) ABSTRACT

A method is provided for manufacturing an actuator device including a substrate, a vibration plate, lower electrode, and a piezoelectric element having a piezoelectric layer, and an upper electrode. The vibration plate is formed by forming an insulating film comprised of a columnar crystalline zirconium layer whose surface has an average crystal grain size of about 20 to 50 nm on one surface the substrate, and then thermally oxidizing the zirconium layer into a columnar crystalline zirconium oxide layer whose surface has an average crystal grain size of about 20 to 50 nm. The zirconium layer shows an XRD pattern having a (002) plane peak with an FWHM of 0.4 or less. The piezoelectric element is formed on the lower electrode.

1 Claim, 8 Drawing Sheets

Zr FILM FWHM AND ZrO₂ FILM ADHESION

METHOD FOR MANUFACTURING ACTUATOR DEVICE AND LIQUID EJECTING HEAD INCLUDING ACTUATOR DEVICE PREPARED BY THE METHOD

The entire disclosure of Japanese Patent Application No. 2006-88889 filed Mar. 28, 2006 as expressly incorporated by reference herein.

BACKGROUND

1. Technical Field

The present invention relates to a method for manufacturing an actuator device and a liquid ejecting head. More specifically, the invention relates to a method of manufacturing an actuator device including a substrate, vibration plate, lower electrode and a piezoelectric element.

2. Related Art

Generally, actuator devices include a piezoelectric element that reacts when a voltage is applied, and can be used in a liquid ejecting head for ejecting liquid droplets. One example of a liquid ejecting head is an ink jet recording head. Typically, the ink jet recording head includes pressure generating chambers communicating with nozzle apertures, wherein part of the pressure generating chambers are made from a vibration plate. The vibration plate is moved by piezoelectric elements such that the ink in the pressure generating chambers is pressurized and discharged through the nozzle apertures. Currently, two types of ink jet recording heads generally used: one includes a longitudinal vibration mode piezoelectric actuator that expands and contracts in the axial direction of the piezoelectric element; the other includes a flexural vibration mode piezoelectric actuator.

In the former type, the volume of the pressure generating chamber can be changed by allowing the end of the piezoelectric element to knock against the vibration plate. Accordingly, this type is well-suited for high-density printing, but requires the additional steps of cutting the piezoelectric element into a comb teeth shape corresponding to the pitch of the nozzle apertures, and positioning the teeth so as to align with the respective pressure generating chambers. Unfortunately, this results in a complicated and expensive manufacturing process.

As for the latter type, piezoelectric elements can connect to the vibration plate by a relatively simple process in which a piezoelectric green sheet is put on the pressure generating chambers corresponding to the shape of the chambers and then fired. This type, however, requires a certain degree of area because the system requires the use of flexural vibration, making high-density configurations difficult to achieve.

In order to overcome the disadvantage of the latter type, another design has been proposed in which piezoelectric elements are independently associated with the respective pressure-generating chambers by forming a uniform piezoelectric material layer over the entire surface of the vibration plate using a film-forming technique. Next, the piezoelectric material layer is cut into a pattern corresponding to the shape of the pressure-generating chambers using lithography.

The piezoelectric material layer for the piezoelectric elements can be formed from lead titanate zirconate (PZT), for example. In this instance, when the piezoelectric material layer is fired, lead from the piezoelectric material layer is diffused into the silicon oxide ($SiO_2$) film. This process forms a vibration plate on the surface of the flow channel silicon (Si) substrate. Unfortunately, however, the diffusion of lead lowers the melting point of the silicon oxide, and the silicon oxide may be undesirably melted by the heat used to form the piezoelectric material layer.

In order to solve this problem, the diffusion of lead from the piezoelectric material layer into the silicon oxide film can be prevented by forming an vibration plate comprised of zirconium oxide layer between the silicon oxide film and the piezoelectric material layer (for example, JP-A-11-204849). Unfortunately, the zirconium oxide film has low adhesion to the silicon oxide film, and the vibration plate is likely to separate.

More specifically, the zirconium oxide film is generally formed by depositing a zirconium film using a sputtering method and then thermally oxidizing the zirconium film. The resulting zirconium oxide film has a polycrystalline structure, and its crystals often bunch up together. Further, even if the zirconium oxide film contains columnar crystals, their proportion is low, meaning that the adhesion of the zirconium oxide film to the silicon oxide film is reduced, and the zirconium oxide film is prone to separate.

Accordingly, have been several methods proposed solving this problem. One includes a method for manufacturing an actuator in which the zirconium layer is preferentially oriented under specific conditions before thermal oxidation, and another discloses an actuator device having zirconium oxide preferentially oriented under specific conditions (for example, JP-A-2005-166719 and JP-A-2005-176433).

In practice, however, the adhesion varies even if the orientation is controlled, and satisfying actuator devices are not always achieved. This problem exists not only in the manufacturing process of actuator devices used in liquid ejecting heads, like ink jet recording heads, but also in the manufacturing process of actuator devices used in other apparatuses.

BRIEF SUMMARY OF THE INVENTION

An advantage of some aspect of the invention is that it provides a method for manufacturing an actuator having high durability and reliability by preventing the separation of the vibration plate. Further, the invention discloses a liquid ejecting head including an actuator device manufactured by the method.

One aspect of the invention, describes a method for manufacturing an actuator including a substrate, a vibration plate, lower electrode, and a piezoelectric element having a piezoelectric layer, and an upper electrode. The method comprises forming the vibration plate by creating an insulating film by forming a columnar crystalline zirconium layer on one surface of the substrate, whose surface has an average crystal grain size of about 20 to 50 nm, and then thermally oxidizing the columnar crystalline zirconium layer into a columnar crystalline zirconium oxide layer whose surface has an average crystal grain size of about 20 to 50 nm. In this instance, the zirconium layer shows an XRD pattern having a (002) plane peak with an FWHM of 0.4 or less. The lower electrode is then formed on the insulating film and a piezoelectric element is formed on the lower electrode.

Another aspect of the invention discloses a liquid ejecting head which includes a flow channel substrate and an actuator device prepared by the method described above which is disposed on one surface of the flow channel substrate. The flow channel substrate includes a pressure generating chamber communicating with a nozzle aperture through which a liquid is ejected.

BRIEF DESCRIPTION OF THE DRAWINGS

The invention will be described with reference to the accompanying drawings, wherein like numbers reference like elements.

DETAILED DESCRIPTION OF THE INVENTION

The invention will now be described in detail with reference to the following embodiment.

Figure 1:
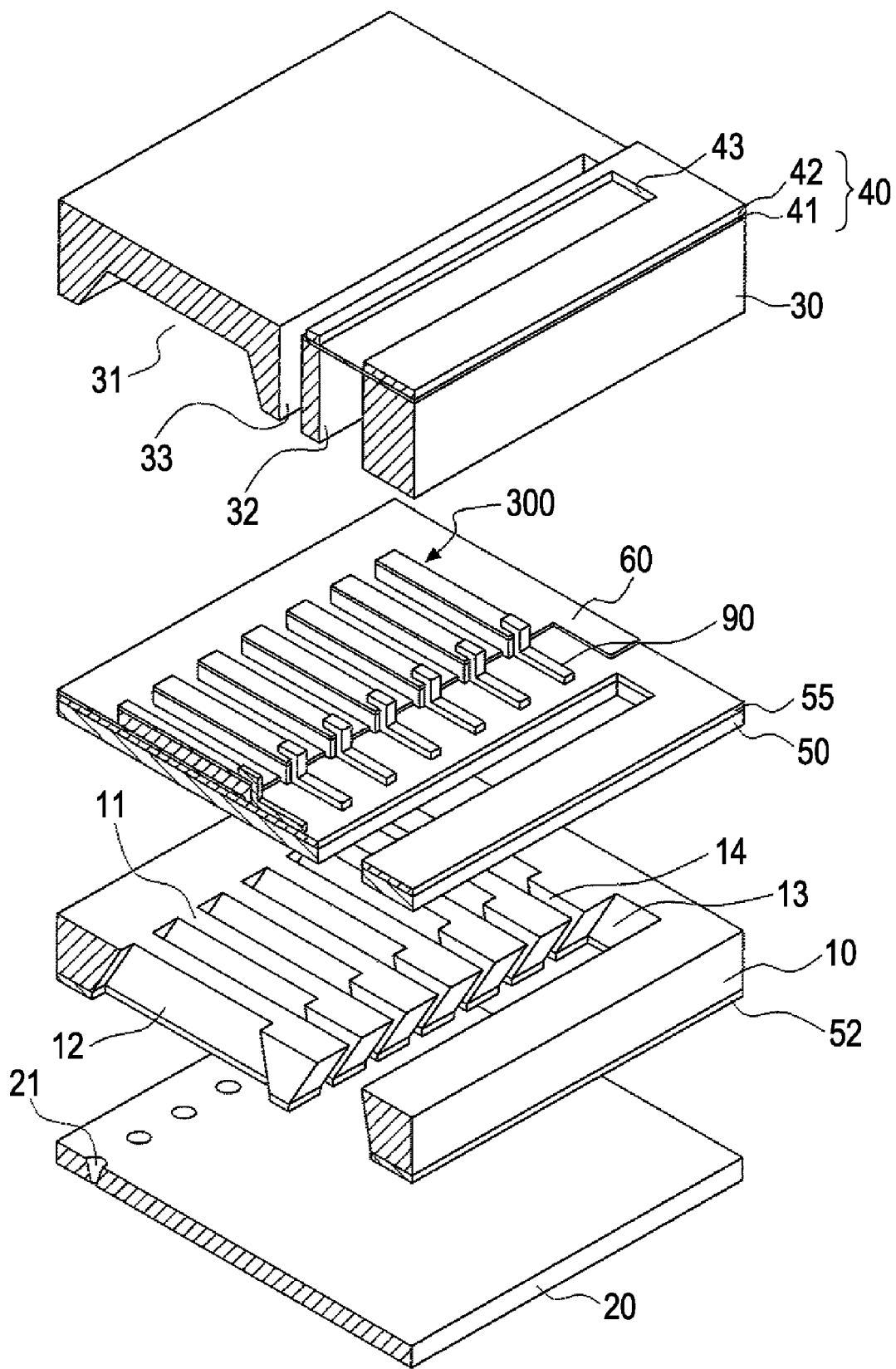
FIG. 1 is an exploded perspective view of a recording head according to an embodiment of the invention.
Figure 2A:
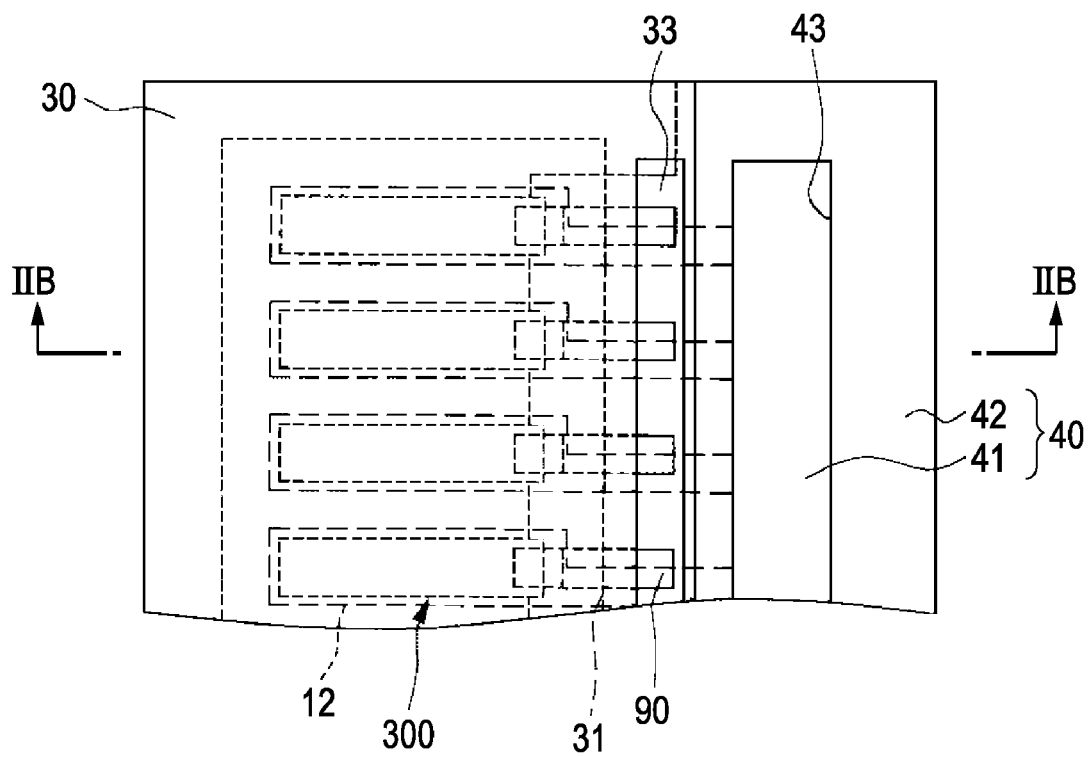
FIG. 2A is a plan view of the recording head according to the embodiment.
Figure 2B:
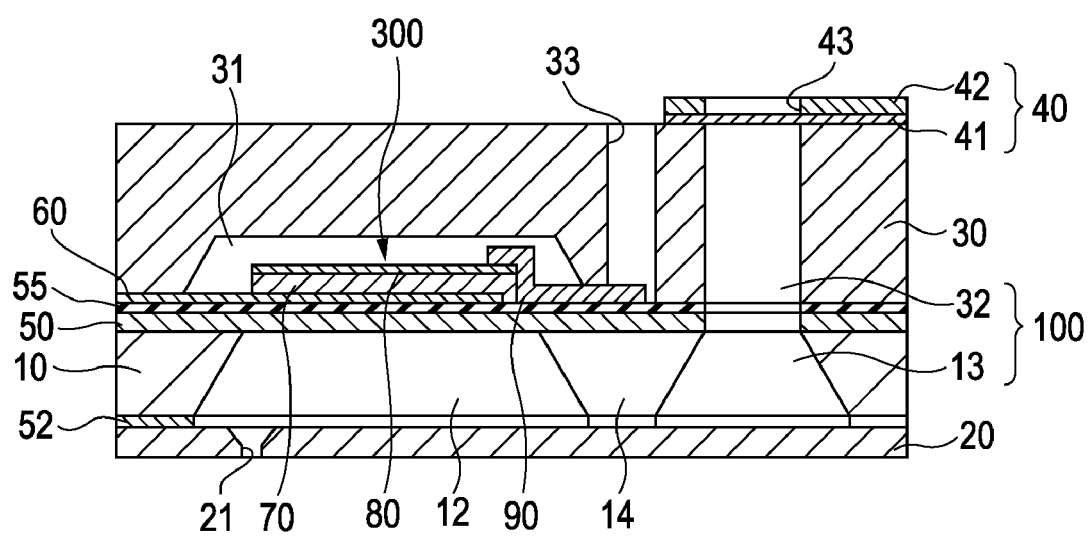
FIG. 2B is a sectional view of the recording head.

FIG. 1 is an exploded perspective view of an ink jet recording head including an actuator according to an embodiment of the invention, and FIGS. 2A and 2B are a plan view and a sectional view of the ink jet recording head shown in FIG. 1 respectively. As shown in these figures, the ink jet recoding head includes a flow channel substrate 10. The flow channel substrate of the embodiment is made of (110) plane-oriented silicon single crystal, and has a silicon dioxide elastic film 50 previously formed to a thickness of 1 to 2 µm on one surface by thermal oxidation. The flow channel substrate 10 has a plurality of pressure-generating chambers 12 arranged in parallel in their width direction. In addition, a communicating section 13 is formed in the flow channel substrate 10 on the outer side in the longitudinal direction of the pressure-generating chambers 12. The communicating section 13 communicates with the pressure-generating chambers 12 through ink supply channels 14 provided for each pressure-generating chamber 12.

The communicating section 13 communicates with the reservoir section of the protective substrate described below to define part of a reservoir serving as a common ink chamber of the pressure generating chambers 12. The ink supply channel 14 has a smaller width than the pressure-generating chamber 12, so that the flow channel resistance of the ink flowing from the communicating section 13 to the pressure-generating chamber 12 is kept constant.

A nozzle plate 20 is bonded to the open side of the flow channel substrate 10 with an adhesive or heat welding film, with a mask layer more fully described below placed in between the flow channel substrate 10 and the nozzle plate 20. The nozzle plate 20 has nozzle apertures 21 communicating with the respective ends of the pressure generating chambers 12 opposite the ink supply channel 14. The nozzle plate 20 can be made of several different materials including but not limited to glass ceramic, silicon single crystal substrate, or stainless steel with a thickness of 0.01 to 1 mm and a linear expansion coefficient of 2.5 to 4.5 ($\times 10^{-6}$/° C.) at 300° C. or less.

The opposing surface of the flow channel substrate 10 is covered with the above-mentioned silicon dioxide ($SiO_2$) elastic film 50 with a thickness of, for example, about 1.0 µm, and an zirconium oxide ($ZrO_2$) insulating film 55 is formed to a thickness of about 0.4 µm on the elastic film 50. The insulating film 55 is formed by forming a columnar crystalline zirconium layer having an average crystal grain size of 20 to 50 nm at the surface and showing an XRD pattern having a (002) plane peak with a full width at half maximum (FWHM) of 0.4 or less, and then thermally oxidizing the zirconium layer into a columnar crystalline zirconium oxide having an average grain size of 20 to 50 nm at the surface, thereby increasing the adhesion to the elastic film 50. The details of the insulating film 55 will be described more fully below.

In this example, the piezoelectric elements 300 are formed on the insulating film 55 by first depositing a lower electrode film 60 to a thickness of about 0.2 µm, followed by a piezoelectric layer 70 with a thickness of about 1.0 µm, and an upper electrode film 80 to a thickness of about 0.05 µm by a below-described process. The previously described thicknesses are included by way of example only may be increased or decreased without affecting the scope of the invention.

Each piezoelectric element 300 is formed on the lower electrode film 60, and includes the piezoelectric layer 70 and the upper electrode film 80. In general, either the lower electrode film or the upper electrode film for the piezoelectric elements 300 may be formed as a common electrode, and the other electrode film and the piezoelectric layer 70 are patterned corresponding to each pressure generating chamber 12. Each patterned portion of the electrode film and piezoelectric layer 70 at which piezoelectric distortion occurs by applying a voltage between both electrodes is referred to as a piezoelectric active portion. In the embodiment, the lower electrode film 60 is formed as the common electrode of the piezoelectric elements 300, and the upper electrode film 80 is formed into individual electrodes of the respective piezoelectric elements 300. The forms and functions of these electrode films may be reversed for various reasons, including the structural convenience of the actuation circuit or wiring. In any case, the piezoelectric active portions are formed for the respective pressure generating chambers. In this embodiment, the piezoelectric elements 300 and the vibration plate displaced by the operation of the piezoelectric element 300 are together called a piezoelectric actuator (actuator). In one embodiment, the elastic film 50, the insulating film 55, and the lower electrode film 60 may act as the vibration plate, and in another embodiment only the elastic film 50 and insulating film 55 may act as the vibration plate.

The upper electrode film 80 of each piezoelectric element 300 is connected to a corresponding leading electrode 90 made of a conductive material such as gold (Au) so that a voltage can be selectively applied to the piezoelectric element 300 through the leading electrode 90.

A protective substrate 30 is bonded to the surface of the flow channel substrate 10 with an adhesive. The protective substrate 30 has a piezoelectric element-protecting section 31 that can ensure such a space as does not interfere with the operation of the piezoelectric element in the region opposing the piezoelectric elements 300. The piezoelectric elements 300 are disposed inside the piezoelectric element-protecting section 31, and are thus protected from external environmental impact. The protective substrate 30 further has a reservoir section 32 in the region corresponding to the communicating section 13 of the flow channel substrate 10. In the embodiment, the reservoir section 32 passes through the protective substrate 30 in the thickness direction, and extends along the direction in which the pressure generating chambers 12 are arranged in parallel. The reservoir section 32 thus communicates with the communicating section 13 of the flow channel substrate 10 to define a reservoir 100, which is intended to act as a common ink chamber of the pressure generating chambers 12.

A through hole 33 passing through the protective substrate 30 in the thickness direction is formed in the protective substrate 30 between the piezoelectric element-protecting section 31 and the reservoir section 32. Part of the lower electrode film 60 and the ends of the leading electrodes 90 are exposed in the through hole 33 and connected to an end of the wiring extending from a driving IC (not shown).

The protective substrate 30 may be made of glass, ceramics, metal, resin, or any other number of materials. Preferably, it is made of a material having substantially the same thermal expansion coefficient as the flow channel substrate 10. In the embodiment, a silicon single crystal substrate, which is the material of the flow channel substrate 10, is used as the protective substrate 30.

A compliance substrate 40 including a sealing film 41 and a fixing plate 42 is bonded on the protective substrate 30. The sealing film 41 is made of a less rigid, flexible material (for example, 6 μm thick polyphenylene sulfide (PPS) film) and seals one surface side of the reservoir section 32. The fixing plate 42 is made of a hard material, such as a metal (for example, a 30 μm thick stainless steel (SUS)). The region of the fixing plate 42 opposing the reservoir 100 is completely removed in the thickness direction to form an opening 43. Thus, one side of the reservoir 100 is sealed with only the flexible sealing film 41.

The thus structured ink jet recording head of the embodiment receives ink from an external ink feeder (not shown) to fill the inside from the reservoir 100 to the nozzle apertures 21. Then, a voltage is applied between the lower electrode film 60 and each upper electrode film 80 corresponding to the respective pressure generating chambers 12 to warp and deform the elastic film 50, the insulating film 55, the lower electrode film 60, and the piezoelectric layer 70. Thus, the pressure in each pressure generating chamber 12 is increased to discharge the ink through the nozzle apertures 21.

Figure 3A:
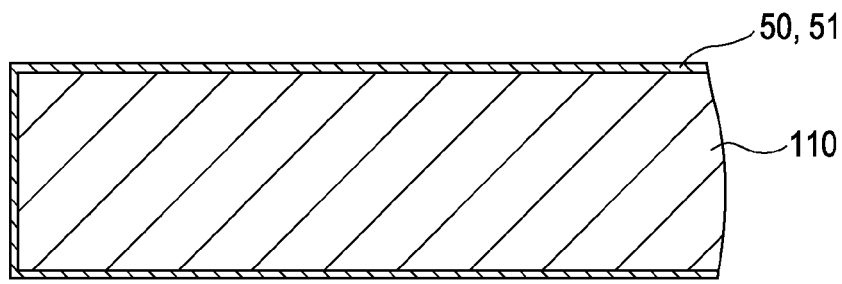
FIGS. 3A to 3D are sectional views of a manufacturing process of the recording head according to the embodiment.

A method for manufacturing the ink jet recording head will now be described with reference to FIGS. 3A to 5B. FIGS. 3A to 5B are sectional views taken along the longitudinal direction of the pressure generating chambers 12. First, as shown in FIG. 3A, a silicon wafer 110 for the flow channel substrate is thermally oxidized in a diffusion furnace of about 1100° C. to form a silicon dioxide film 51 acting as the elastic film 50 at the surface. In one embodiment, the silicon wafer 110 for the flow channel substrate has a relatively large thickness of about 625 μm. The silicon wafer can be made of, for example, silicon single crystal.

Figure 3B:
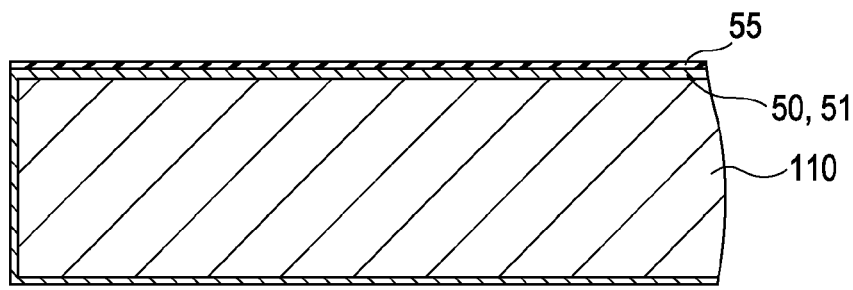

Turning to FIG. 3B, a zirconium oxide insulating film 55 is formed on the elastic film 50 (silicon dioxide film 51). More specifically, in this embodiment, a zirconium layer is first formed on the elastic film 50 by a sputtering method such as DC sputtering. In this instance, the zirconium layer is formed under specific conditions so that the zirconium layer is constituted of columnar crystals with an average crystal grain size of 20 to 50 nm at the surface and exhibits a XRD pattern having a (002) plane peak with a FWHM of 0.4 or less.

The FWHM (full width at half maximum) refers to the difference in diffraction angle between two points at which the XRD value is equal to half of the maximum of a peak. The XRD pattern of the zirconium layer has peaks of diffraction intensity corresponding to the (002) plane, (100) plane, and (101) plane. In the embodiment, the (002) plane peak should be largest. Hence, it is necessary that the zirconium layer be preferentially oriented in the (002) plane. More specifically, the proportion of the (002) plane diffraction peak intensity preferably accounts for 60% or more, and more preferably 70% or more, and still more preferably 80% or more.

In order to achieve such a zirconium layer, it is preferable that the zirconium layer be formed using a method such as sputtering at a temperature of between room temperature to 100° C. Thus, the resulting layer can be preferentially oriented in the (002) plane and the crystal grains can be columnar and as small as possible. In this instance, room temperature is taken to be roughly 20 to 25 degrees Celsius with an average of 23° C.

The sputtering for forming the zirconium layer is preferably performed under a pressure of 0.3 to 1 Pa, from the viewpoint of forming a zirconium layer preferentially orientated in the (002) plane with a small (002) plane FWHM. In addition, the power density for sputtering is preferably set to 1 to 20 kW/m$^2$ from the viewpoint of forming a zirconium layer preferentially orientated in the (002) plane, having a small grain size and a small FWHM.

The formed zirconium layer is then thermally oxidized by transferring the flow channel substrate wafer 110 into a diffusion furnace heated to between 600 to 1000° C., preferably about 900° C., at a speed of 300 mm/min or more, preferably 500 mm/min. Thus, the insulating film 55 is formed with good crystal state preferentially oriented in (−111) plane. Specifically, the zirconium oxide of the insulating film 55 is in a state of columnar crystals continuing from the lower surface to the upper surface.

Consequently, the adhesion between the elastic film 50 and the insulating film 55 is greatly increased in order to prevent the separation of the vibration plate. Thus, the actuator device of the resulting ink jet recording head can exhibit high durability and reliability.

Figure 3C:
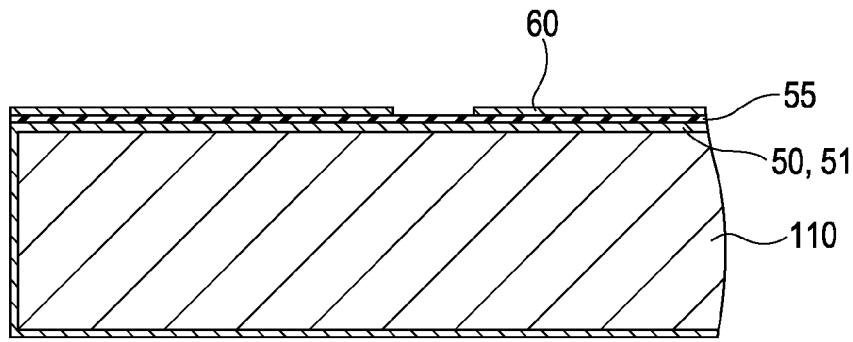
Figure 3D:
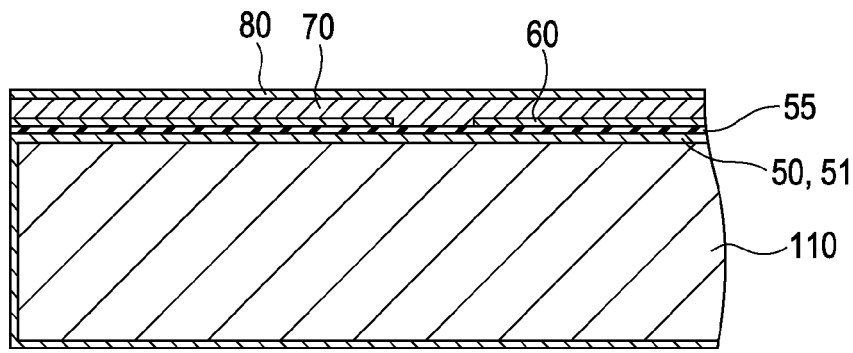

After the formation of the insulating film 55, the lower electrode film 60 is formed by depositing, for example, platinum and iridium on the insulating film 55, as shown in FIG. 3C. The lower electrode film 60 is patterned into a predetermined shape. Turning to FIG. 3D, a piezoelectric layer 70 made of, for example, lead titanate zirconate (PZT) and an upper electrode film 80 made of iridium are formed over the entire surface of the flow channel substrate wafer 110. In the embodiment, the lead titanate zirconate (PZT) piezoelectric layer 70 is formed by a so-called sol-gel process, in which a sol prepared by dissolving or dispersing an organic metal in a catalyst is applied and dried to gelate, and is further fired at a high temperature to form a metal oxide piezoelectric layer 70.

In the resulting piezoelectric layer 70, the lead in the piezoelectric layer 70, which generally is subject to undesirably diffusing during the firing process, can be prevented from diffusing into the elastic film 50 because of the presence of the insulating film 55 underlying the piezoelectric layer 70.

Figure 4A:
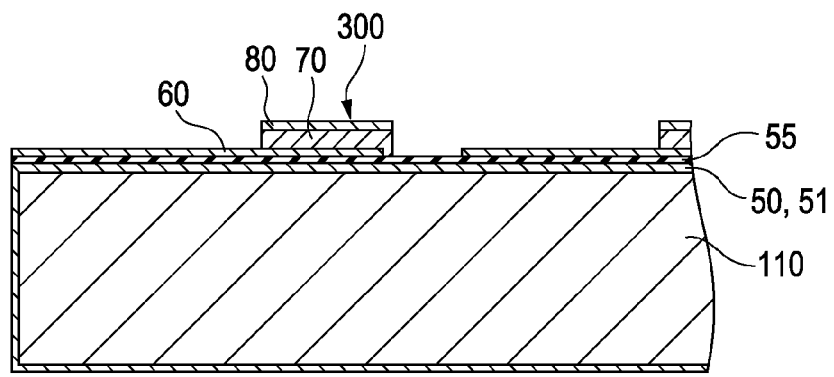
FIGS. 4A to 4D are sectional views of the manufacturing process of the recording head according to the embodiment.
Figure 4B:
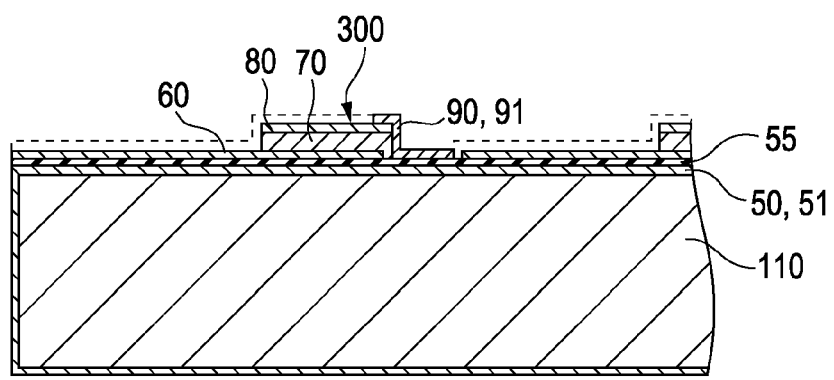

Turning to FIG. 4A, the piezoelectric layer 70 and the upper electrode film 80 are patterned into the piezoelectric elements 300 so as to oppose the pressure generating chambers 12. Then, the leading electrodes 90 are formed. Specifically, a metal layer 91 is formed of a metal such as gold (Au) over the entire surface of the flow channel substrate wafer 110, as shown in FIG. 4B. Then, the metal layer 91 is patterned for each piezoelectric element 300 through a mask pattern (not shown) made of resist, for example, thus forming the leading electrodes 90.

Figure 4C:
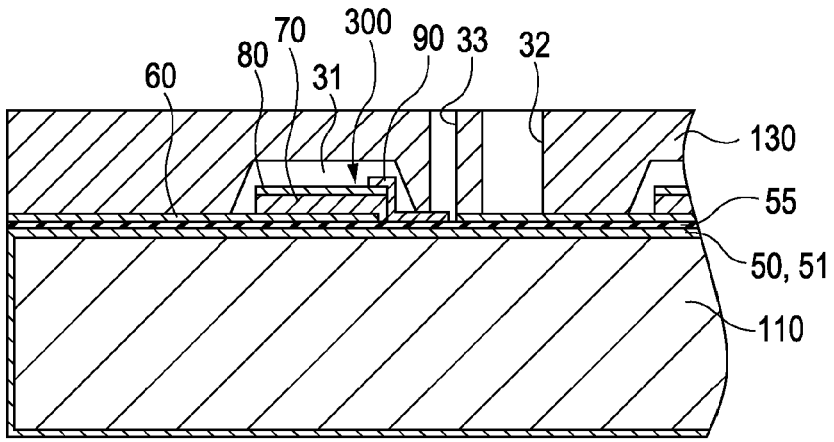

Turning to FIG. 4C, a protective substrate silicon wafer 130 for a plurality of protective substrates 30 is bonded to the surface of the flow channel substrate wafer 110. The protective substrate wafer 130 has a thickness of about 400 μm. By bonding the protective substrate wafer 130 to the flow channel substrate wafer 110, the stiffness of the flow channel substrate wafer 110 is extremely increased.

Figure 4D:
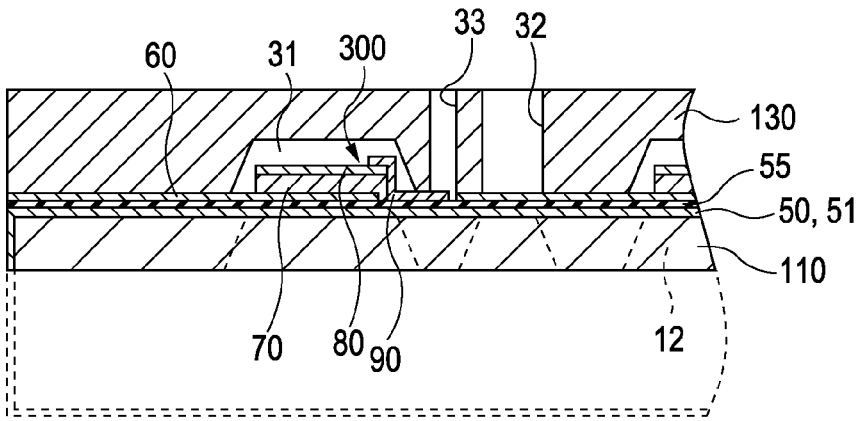
Figure 5A:
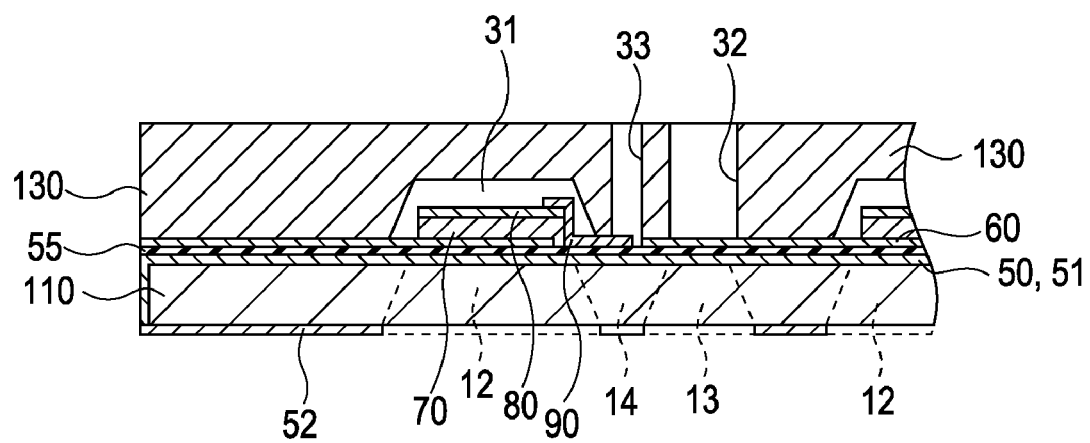
FIGS. 5A and 5B are sectional views of the manufacturing process of the recording head according to the embodiment.
Figure 5B:
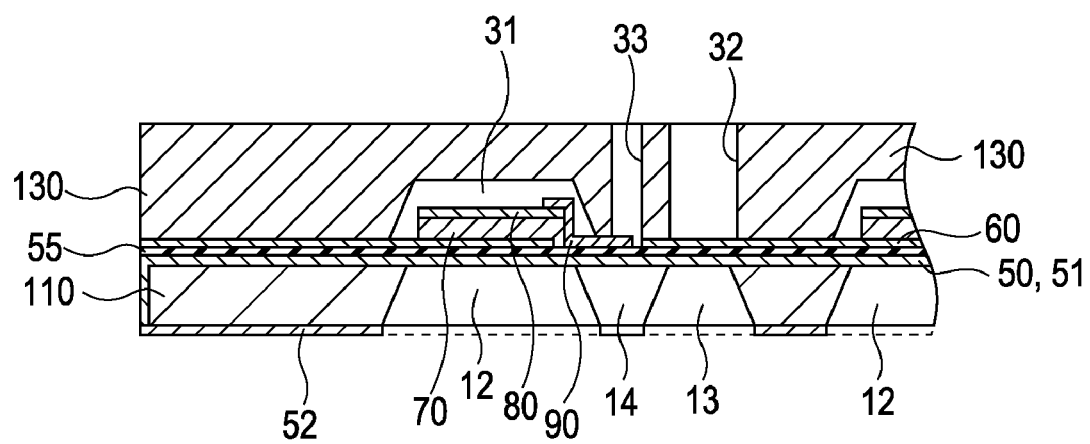

Turning to FIG. 4D, the flow channel substrate wafer 110 is ground to a specified level of thickness, and then further wet-etched with fluoronitric acid to a predetermined thickness. In the embodiment, for example, the flow channel substrate wafer 110 is etched to a thickness of about 70 μm. Then, a mask layer 52 is formed from silicon nitride (SiN) on the flow channel substrate wafer 110 and patterned into a predetermined shape, as shown in FIG. 5A. The flow channel substrate wafer 110 is anisotropically etched through the mask layer 52. Thus, the pressure generating chambers 12, the communicating section 13, and the ink supply channels 14 are formed in the flow channel substrate wafer 110, as shown in FIG. 5B.

Unnecessary portions of the flow channel substrate wafer 110 and the protective substrate wafer 130 at their outer edges are removed using a cutting process, such as dicing.

The nozzle plate 20 having the nozzle apertures 21 is bonded on the opposing surface of the flow channel substrate wafer 110, and the compliance substrate 40 is bonded to the protective substrate wafer 130. The resulting structure including the flow channel substrate wafer 110 is cut into chip-size pieces including the flow channel substrate 10, as shown in FIG. 1. Thus, the ink jet recording head of the embodiment is completed.

Example 1

During one method for manufacturing the ink jet recording head, a zirconium layer was deposited on the elastic film 50 by DC sputtering at room temperature, at a powder density of 5 kW/m² and a sputtering pressure of 0.5 Pa. The zirconium layer was then heated at a rate of 20° C./s and held at 900° C. for 5 minutes, and thus thermally oxidized into a zirconium oxide insulating film 55.

Figure 6:
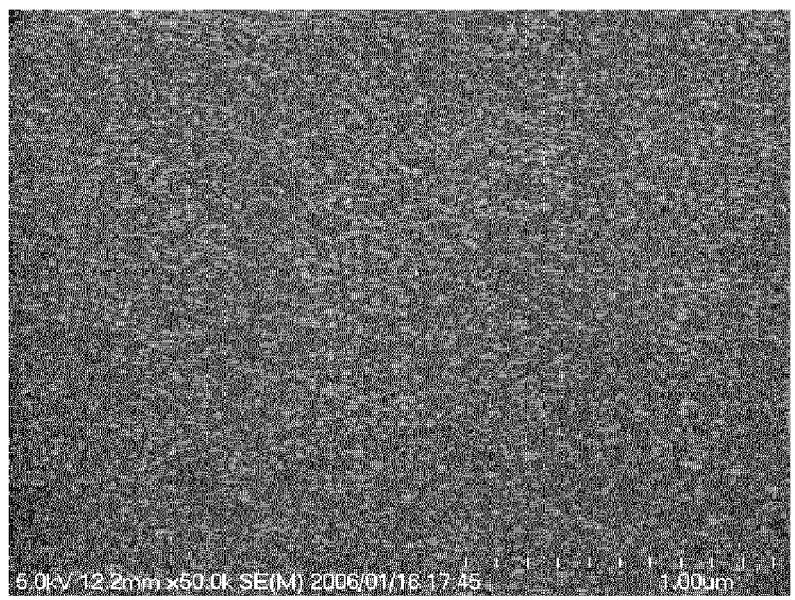
FIG. 6 is an SEM micrograph of a zirconium layer formed in EXAMPLE 1.

The XRD peaks of the zirconium layer were observed. The peak of the (002) plane accounted for 85% and its FWHM was about 0.35 on an average. The FWHM was measured at 7 points of the wafer. FIG. 6 shows an SEM micrograph of the surface of the zirconium layer. This SEM micrograph shows that columnar crystals were grown in the direction perpendicular to the surface of the zirconium layer and that the grain size was about 30 nm on average.

The zirconium oxide insulating film 55 was observed by SEM. As a result, the columnar crystals were hardly expanded by thermal oxidation and their grain size was kept 30 nm.

The adhesion between the zirconium oxide insulating film 55 and the elastic film 50 was measured at three points of the wafer. As a result, the adhesion was more than 350 mN.

Example 2

A zirconium layer was formed in the same manner as in EXAMPLE 1 except that deposition was performed at 150° C. The zirconium layer was then thermally oxidized to form the zirconium oxide insulating film 55 under the same conditions as in EXAMPLE 1.

Figure 7:
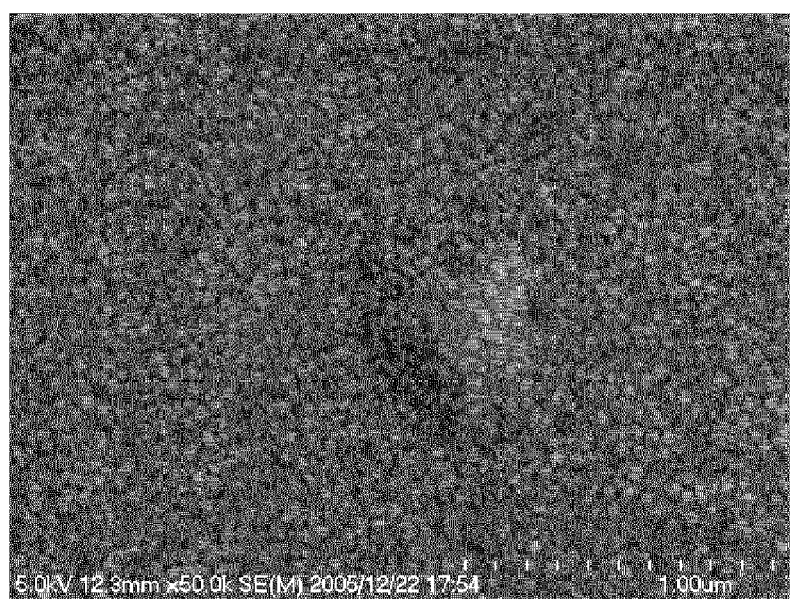
FIG. 7 is an SEM micrograph of a zirconium layer formed in EXAMPLE 2.

The XRD peaks of the zirconium layer were observed. The peak of the (002) plane accounted for 97% and its FWHM was about 0.25. The FWHM was measured at 7 points of the wafer. FIG. 7 shows an SEM micrograph of the surface of the zirconium layer. This SEM micrograph shows that the columnar crystals of the zirconium layer had an average grain size of about 55 to 60 nm, and that abnormally grown columnar crystals were observed.

Also, the zirconium oxide insulating film was observed by SEM. As a result, it was found that the columnar crystals were expanded to some extent by thermal oxidation and their average grain size was about 60 nm.

The adhesion between the zirconium oxide insulating film and the elastic film was measured at three points of the wafer. As a result, the adhesion was about 320 to 330 mN.

Example 3

A zirconium layer was formed at room temperature, and at a power of 1 kW, a power density of 10 kW/m², and a sputtering pressure of 4 Pa. Then, the zirconium layer was thermally oxidized to form the zirconium oxide insulating film 55 under the same conditions as in EXAMPLE 1.

Figure 8:
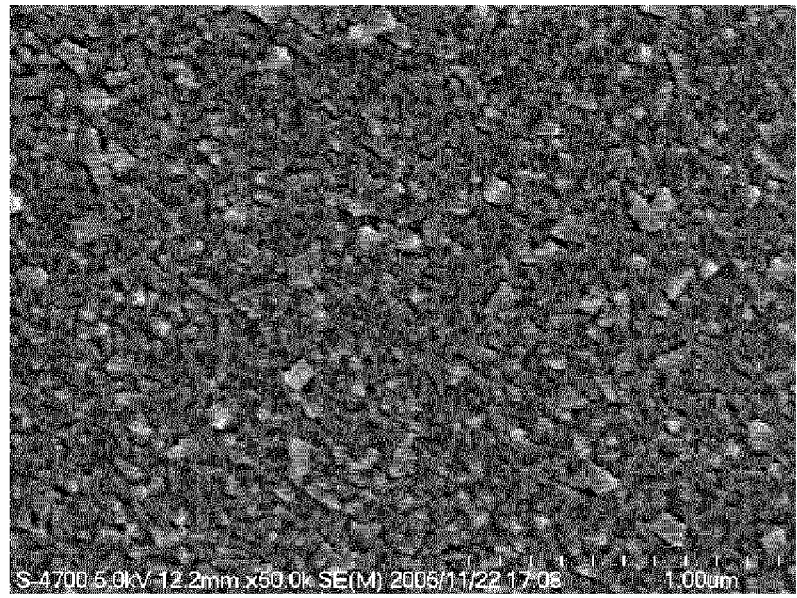
FIG. 8 is an SEM micrograph of a zirconium layer formed in EXAMPLE 3.

The XRD peaks of the zirconium layer were observed. The peak of the (002) plane accounted for almost 60% and its FWHM varied around 0.5. The FWHM was measured at 7 points of the wafer. FIG. 8 shows an SEM micrograph of the surface of the zirconium layer. This SEM micrograph shows that the columnar crystal grains of the zirconium layer were large while grains varied in size and form mingled, and that there were crystal grains other than columnar crystals aligned in the direction perpendicular to the plane.

The adhesion between the zirconium oxide insulating film and the elastic film was measured at three points of the wafer. As a results, the adhesion was about 90 mN and very low.

Example 4

A zirconium layer was formed in the same manner as in EXAMPLE 3 except that deposition was performed at 150° C. The zirconium layer was then thermally oxidized to form the zirconium oxide insulating film 55 under the same conditions as in EXAMPLE 3.

Figure 9:
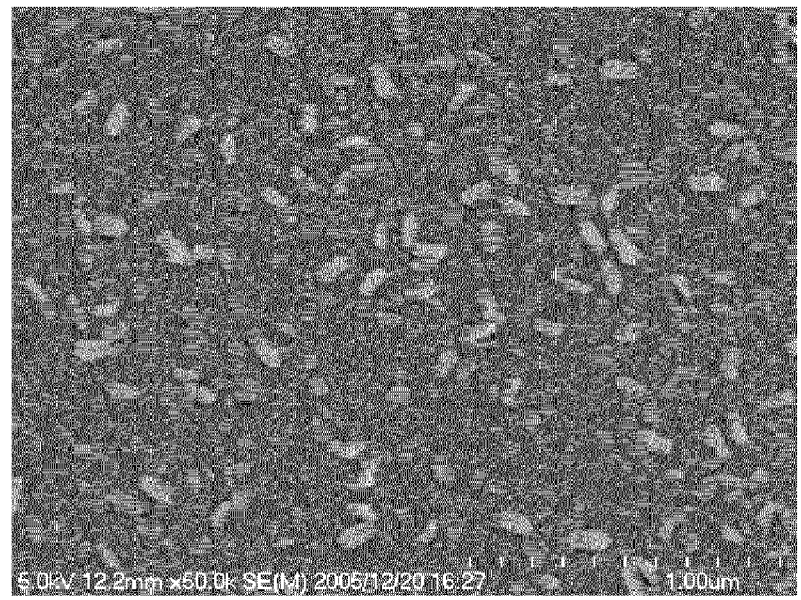
FIG. 9 is an SEM micrograph of a zirconium layer formed in EXAMPLE 4.

The XRD peaks of the zirconium layer were observed. The peak of the (002) plane accounted for 85% and its FWHM was about 0.4 or less. The FWHM was measured at 7 points of the wafer. FIG. 9 shows an SEM micrograph of the surface of the zirconium layer. This SEM micrograph shows that the columnar crystal grains of the zirconium layer were still larger than those in EXAMPLE 3 while grains varied in size and form mingled, and that there were crystal grains other than columnar crystals aligned in the direction perpendicular to the plane, such as tubular crystals growing in the direction of the plane. The tubular crystals probably result from the growth of (110) plane crystals.

The adhesion between the zirconium oxide insulating film and the elastic film was measured at three points of the wafer. As a result, the adhesion was as low as about 250 mN.

RESULTS

Figure 10:
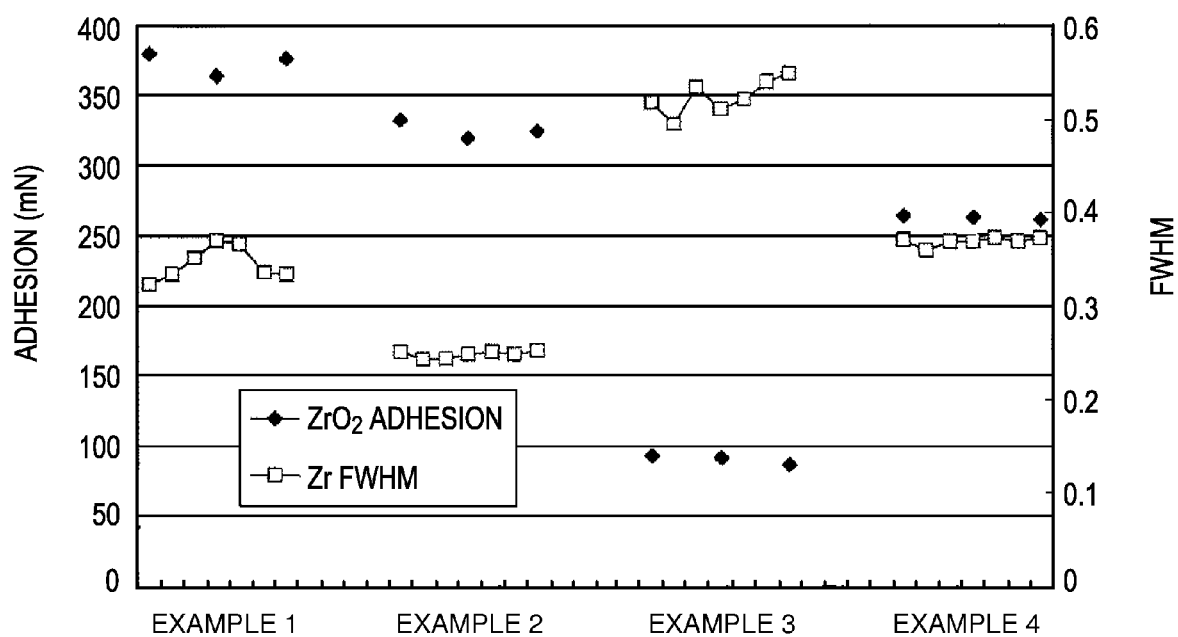
FIG. 10 is a graph showing the full width at half maximum and the adhesion in the EXAMPLES 1-4.

The FWHM's and adhesions of each of the EXAMPLES 1-4 are shown in FIG. 10.

From these results and FIGS. 6 to 9, it has been found that a zirconium layer having an average crystal grain size of 20 to 50 nm and showing an XRD pattern having a (002) plane with an FWHM of 0.4 or less, as in EXAMPLE 1, can form a zirconium oxide layer made of columnar crystals continuing from the lower surface to the upper surface. On the other hand, a zirconium layer having a grain size of more than 50 nm, as in EXAMPLE 2, results in a zirconium oxide layer with a low adhesion even if the FWHM is small. It has also been found that a zirconium layer having a still larger grain size results in a zirconium oxide layer with a low adhesion irrespective of whether the FWHM is large (EXAMPLE 3) or small (EXAMPLE 4).

While the present invention has been described with reference to an exemplary embodiment, it is to be understood that the invention is not limited to the disclosed embodiment. For example, while in the above embodiment, the insulating film 55 is formed on the elastic film 50, the insulating film 55 is only required to be disposed closer to the piezoelectric layer 70 than the elastic film 50. For example, the elastic film 50 and the insulating film 55 may be separated by another layer. While the above embodiment illustrates an ink jet recording head as an example of the liquid ejecting head of the invention, the structure of the liquid ejecting head is not limited to that described in the embodiment. The invention covers liquid ejecting heads in general, including a head used for ejecting a liquid other than ink. Such liquid ejecting heads include, for example, recording heads used in printers and other image recording apparatuses, color material ejecting heads used for manufacturing color filters of liquid crystal displays, electrode material ejecting heads used for forming electrodes of organic EL displays, FED's (field emission displays), and so forth, as well as bioorganic material ejecting heads used for manufacturing biochips.

In addition, the method of the invention can be applied to actuators used in any type of apparatus in addition to those used in liquid ejecting heads.

What is claimed is:

1. A method for manufacturing an actuator device including a substrate, a vibration plate, and a piezoelectric element, respectively placed in a stacked manner, the method comprising:

forming the vibration plate, wherein the steps for forming the vibration plate include:
   forming a silicon oxide elastic film on the surface of the substrate;
   forming a columnar crystalline zirconium layer on the silicon oxide elastic film with an average crystal grain size of about 20 to 50 nm which shows an XRD pattern having a (002) plane peak with an FWHM of 0.4 degrees or less using a DC sputtering method performed at a temperature between room temperature and 100° C. at a pressure of between 0.3 to 1 Pa at a power density of between 1 to 20 kW/m$^2$; and
   thermally oxidizing the columnar crystalline zirconium layer in a diffusion furnace heated to between 600 to 1000° C. at a speed of 300 mm/min or more such that the columnar crystalline zirconium layer is oriented in the (−111) plane; and forming the piezoelectric element on the vibration plate, including a lower electrode formed on the columnar crystalline zirconium layer, a piezoelectric layer of lead titanate zirconate formed on the lower electrode, and an upper electrode formed on the piezoelectric layer.

* * * * *